US011149991B2

(12) United States Patent
Seon (10) Patent No.: US 11,149,991 B2
(45) Date of Patent: Oct. 19, 2021

(54) HEATING AND COOLING APPARATUS HAVING MOISTURE REMOVAL FUNCTION FOR TESTING ELECTRICAL CHARACTERISTIC OF SEMICONDUCTOR ELEMENT USING PROBE SYSTEM

(71) Applicant: Yang Yoon Seon, Seoul (KR)

(72) Inventor: Yang Yoon Seon, Seoul (KR)

( * ) Notice: Subject to any disclaimer, the term of this patent is extended or adjusted under 35 U.S.C. 154(b) by 182 days.

(21) Appl. No.: 16/277,387

(22) Filed: Feb. 15, 2019

(65) Prior Publication Data

US 2020/0266115 A1   Aug. 20, 2020

(51) Int. Cl.
| F25B 9/04 | (2006.01) |
| H01L 21/66 | (2006.01) |
| C03B 27/044 | (2006.01) |
| H01L 21/67 | (2006.01) |
| G01R 31/28 | (2006.01) |

(52) U.S. Cl.
CPC .............. *F25B 9/04* (2013.01); *C03B 27/044* (2013.01); *H01L 21/67109* (2013.01); *H01L 21/67248* (2013.01); *H01L 22/14* (2013.01); *H01L 22/34* (2013.01)

(58) Field of Classification Search
CPC ........................................................ F25B 9/04
See application file for complete search history.

(56) References Cited

U.S. PATENT DOCUMENTS

| 1,952,281 | A | * | 3/1934 | Fanque | ...................... F25B 9/04 |
| | | | | | 62/5 |
| 2,644,315 | A | * | 7/1953 | Jamieson | .................. F25B 9/04 |
| | | | | | 62/5 |
| 2,920,457 | A | * | 1/1960 | Bartlett, Jr. | ............... F25B 9/04 |
| | | | | | 62/5 |
| 3,224,499 | A | * | 12/1965 | Reinecke | ............... G01N 30/30 |
| | | | | | 165/263 |

(Continued)

FOREIGN PATENT DOCUMENTS

| JP | 03079969 A | * | 4/1991 | ................ F25B 9/04 |
| JP | 06182976 A | * | 7/1994 | ................ F25B 9/04 |

(Continued)

OTHER PUBLICATIONS

Thermal Mass Flow Meter / Controller (Principle of operation) E, https://www.youtube.com/watch?v=G62ma2lFh9o, Jun. 17, 2014. (Year: 2020).*

(Continued)

*Primary Examiner* — Christopher R Zerphey
*Assistant Examiner* — Bejeir Brooks
(74) *Attorney, Agent, or Firm* — DeLio Peterson & Curcio LLC; Thomas E. Ciesco (57) ABSTRACT

The present disclosure relates to a heating and cooling apparatus having a moisture removal function for testing electrical characteristics of a semiconductor element using a probe system, in which the heating and cooling apparatus is configured to be capable of hot and cold measurement of a wafer or a flat panel display product and to be capable of (Continued)

efficiently removing water droplets generated at the time of cooling by adding a vortex tube to a thermo-stream provided in a probe head of the probe system and configuring the vortex tube to be interlocked with a moisture removal device.

2 Claims, 6 Drawing Sheets

(56) References Cited

U.S. PATENT DOCUMENTS

| | | | | |
|---|---|---|---|---|
| 3,361,336 | A * | 1/1968 | Foa | F25B 9/04 |
| | | | | 417/53 |
| 2008/0303283 | A1* | 12/2008 | Sullivan | F25B 9/04 |
| | | | | 290/54 |
| 2010/0139292 | A1* | 6/2010 | Grand | F25B 9/04 |
| | | | | 62/5 |

FOREIGN PATENT DOCUMENTS

| | | | | | |
|---|---|---|---|---|---|
| KR | | 100981773 | B1 * | 9/2010 | F25B 9/04 |
| KR | | 100981773 | B1 | 9/2010 | |
| KR | | 20100095866 | A * | 9/2010 | G01J 1/42 |
| KR | | 20100095866 | A | 9/2010 | |
| WO | WO-2015187864 | A1 * | 12/2015 | F17C 11/00 |

OTHER PUBLICATIONS

How a Mass Flow Controller works, https://www.youtube.com/watch?v=BfdwD1V3jNk, Mar. 9, 2014. (Year: 2020).*

* cited by examiner

HEATING AND COOLING APPARATUS HAVING MOISTURE REMOVAL FUNCTION FOR TESTING ELECTRICAL CHARACTERISTIC OF SEMICONDUCTOR ELEMENT USING PROBE SYSTEM

BACKGROUND OF THE INVENTION

1. Field of the Invention

The present disclosure relates to a heating and cooling apparatus having a moisture removal function for testing the electrical characteristics of a semiconductor element using a probe system. More particularly, the present disclosure relates to a heating and cooling apparatus having a moisture removal function for testing the electrical characteristics of a semiconductor element using a probe system, in which the heating and cooling apparatus is configured to be capable of heating and cooling the wafer or glass surface using compressed air and to be capable of preventing water droplets from being produced on the surface by condensation of moisture in the air during an electrical characteristic test for a circuit pattern formed on a wafer or a glass surface in a process of manufacturing a semiconductor or a display panel.

2. Description of Related Art

In general, a wafer is subjected to a film formation process of growing or adding a thin film of various materials to a wafer surface, a pattern formation process for selectively removing the thin film from the wafer, an implantation process of adding a dopant to change the resistivity and conductivity of a selected region of the wafer, and the like.

Meanwhile, in the manufacture of a flat panel display, a process of manufacturing a lower substrate, a process of manufacturing an upper substrate, and a process of laminating the lower substrate and the upper substrate are performed.

Multiple cells are formed on a glass substrate for manufacturing the lower substrate, multiple horizontal lines and vertical lines are formed in the cells so as to intersect each other in a matrix form, and pixel cells including transparent pixel electrodes are formed at respective intersections of the horizontal lines and the vertical lines.

Thin film transistors connected to the horizontal lines, the vertical lines, and the pixel electrodes are formed in the pixel cells.

The multiple cells formed on the glass substrate are subjected to an inspection process and are then cut through a scribing process. Each of the multiple cells cut off from the glass substrate, that is, each lower substrate is laminated to the upper substrate completed in the process of manufacturing the upper substrate, and a driving circuit for driving the pixel cells and various elements are assembled to complete one flat panel display.

Figure 1:
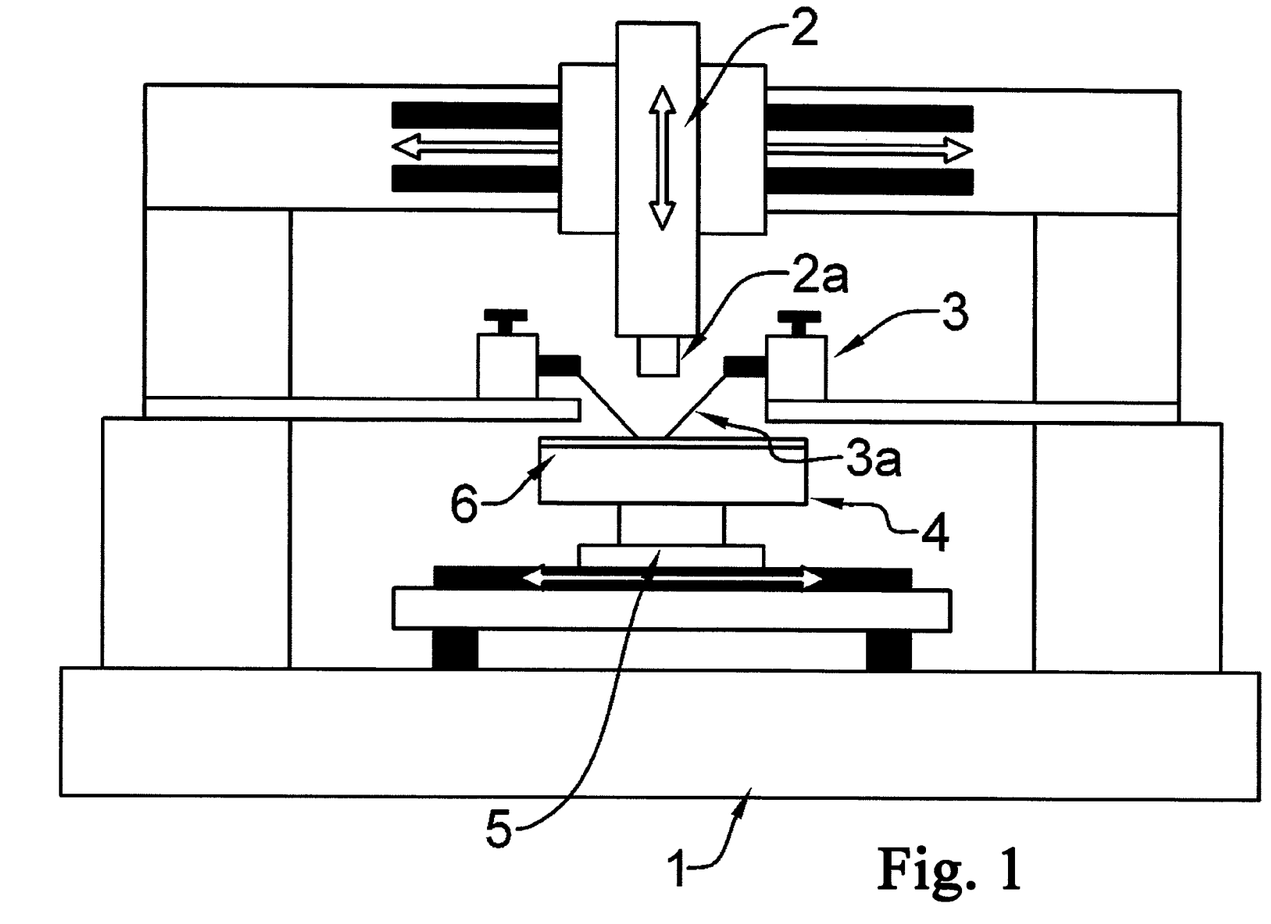
FIG. 1 is a view showing a probe station to which an electrical characteristic test of a conventional heating only method is applied.

Referring to FIG. 1, in the manufacture of a wafer and a flat panel display as described above, electrical characteristics of electrical elements such as a transistor, a resistor, and a capacitor applied to the product are measured through a probe station 1, which is configured to measure the electrical characteristics of each electrical element by bringing a probe pin 3a into contact with the electrical element, which has very small size.

In FIG. 1, reference numeral 2 denotes a scope camera, 2a denotes a lens, 3 denotes an X, Y and Z positioner, 4 denotes a hot chuck, 5 denotes an X, Y and theta motor stage, and 6 denotes a wafer.

The measurement of electrical characteristics in the wafer and the glass is greatly influenced by temperature. Therefore, in an electrical property test, the temperature is also evaluated, and in the case of a flat panel display using a backlight, heat generation by a backlight and a photo current effect caused by the light source of the backlight are evaluated at the same time.

However, a conventional hot chuck for wafer measurement has a structure in which a plate for heating the bottom of a wafer is covered, which makes it difficult to install a light source for measuring a photo current.

Meanwhile, in recent years, because products to which a wafer and a flat panel display are applied are increasingly exposed to a temperature below a normal temperature, an electrical characteristic test is also conducted at a low temperature. In the case of a low-temperature (cooling) measurement, water droplets are randomly generated on the surface of a measurement object when measuring a temperature below the dew point, which makes it difficult to test normal electrical characteristics due to current leakage caused by the water droplets.

Figure 2:
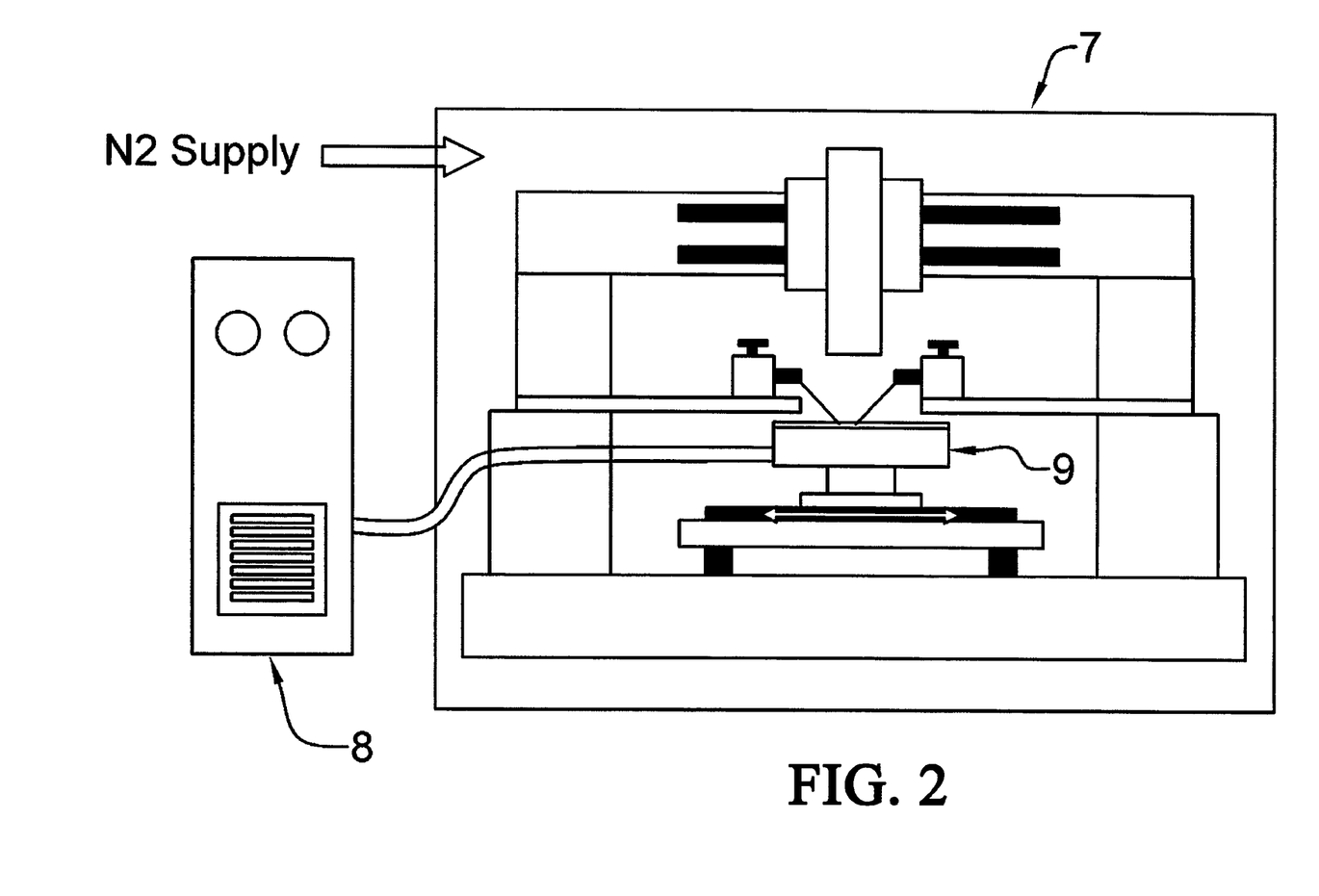
FIG. 2 is a view showing a probe station to which an electrical characteristic test of a conventional heating and cooling method is applied.

As shown in FIG. 2, in the low-temperature electrical characteristic test, the entirety or part of a probe station is configured and provided as a N2 chamber 7 structure, which is purged with N2.

In FIG. 2, reference numeral 8 denotes a cooling chiller, and 9 denotes a hot and cold chuck.

In this case, due to the nature of the chamber, which is a closed structure, it is necessary to wait for sufficient purging of the inside of the chamber when moving the measurement position, and there are also limitations in various aspects such as accessibility due to the sealed structure.

SUMMARY OF THE INVENTION

Accordingly, the present disclosure has been made in order to solve the prior art problems described above, and the present disclosure aims to provide a heating and cooling apparatus having a moisture removal function for testing the electrical characteristics of a semiconductor element using a probe system, in which the heating and cooling apparatus is configured to be capable of hot and cold measurement of a wafer or a flat panel display product and to be capable of efficiently removing water droplets generated at the time of cooling by adding a vortex tube to a thermo-stream provided in a probe head of a probe station and configuring the vortex tube to be interlocked with a moisture removal device.

The present disclosure also aims to provide a heating and cooling apparatus having a moisture removal function for testing the electrical characteristics of a semiconductor element using a probe system, in which an air-cooling chiller and a cooling device using compressed air are installed in a thermo-stream in series such that multi-stage cooling can be implemented.

In view of the problems described above, a heating and cooling apparatus having a moisture removal function for testing the electrical characteristics of a semiconductor element using a probe system according to present disclosure includes: a cooling chiller configured to primarily cool and discharge compressed air which is supplied from an outside and having normal temperature; a flow rate control device installed in an air supply pipe to which the air from the cooling chiller is discharged and configured to adjust the flow rate and hydraulic pressure of the compressed air; a compressed air cooler configured to separately spray the compressed air, a flow rate of which has been adjusted in the flow rate control device, into cold air and hot air after the compressed air has flowed thereinto; a first heater configured to heat cold air from a port at one side of the compressed air cooler to a predetermined temperature so as to adjust the temperature to an accurate temperature required for testing the electrical characteristics; an air nozzle configured to spray the air heated through the first heater to a measurement position for the electrical characteristic test; a second heater configured to heat a hot air from another port of the compressed air cooler to a high temperature required for dehumidification; and a dehumidifying nozzle configured to spray the air heated by the second heater around air sprayed from the air nozzle.

According to the present disclosure described above, it is possible to perform hot and cold measurement of a wafer or a flat panel display product by adding a vortex tube to the front end of a thermo-stream provided in a probe head of a probe system and additionally mounting a moisture removal device on the rear end of the thermo-stream. In this case, since the water droplets generated during cooling can be efficiently removed, it is possible to perform measurement without any special constraints during cooling by bringing a probe pin into contact with a cooled position.

Since the cooling devices including a cooling chiller and a compressed air cooler are installed in series to realize multi-stage cooling, it is possible to easily perform ultra-low temperature measurement at −80° C. or lower, for which a high cost has been conventionally required.

BRIEF DESCRIPTION OF THE DRAWINGS

The features of the invention believed to be novel and the elements characteristic of the invention are set forth with particularity in the appended claims. The figures are for illustration purposes only and are not drawn to scale. The above and other aspects, features and advantages of the present disclosure will be more apparent from the following detailed description taken in conjunction with the accompanying drawings, in which:

DETAILED DESCRIPTION OF THE EXEMPLARY EMBODIMENTS

Hereinafter, the present disclosure configured as described above will be described in detail with reference to the accompanying drawings in which like numerals refer to like features of the invention.

A heating and cooling apparatus having a moisture removal function for testing the electrical characteristics of a semiconductor element using a probe system according to the present disclosure is configured to be capable of hot and cold measurement of a wafer or a flat panel display product by adding a vortex tube to a thermo-stream provided in a probe head of the probe station and configuring the vortex tube to be interlocked with a moisture removal device.

Figure 3A:
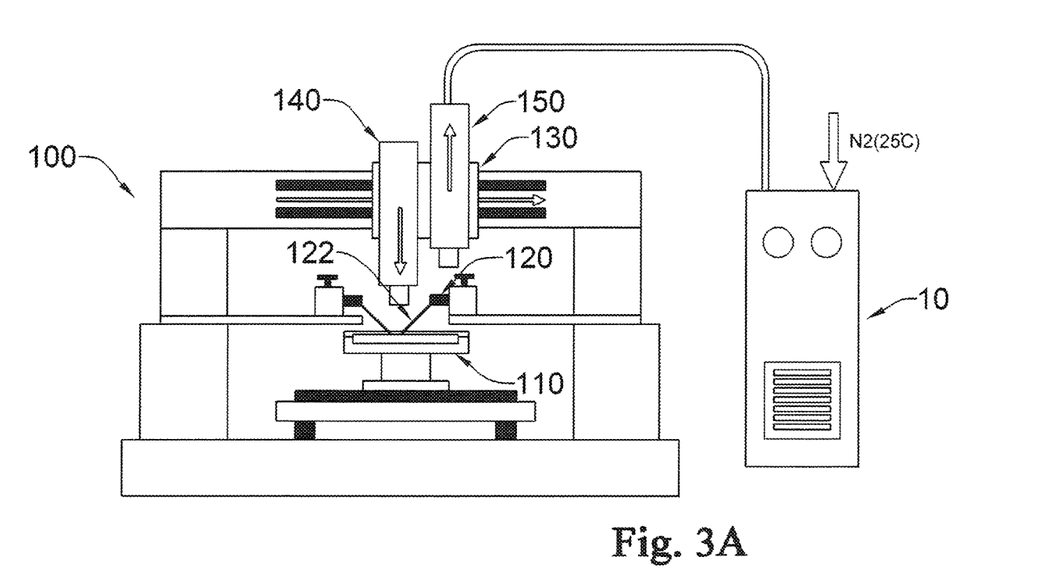
FIG. 3A is a view showing a microscopic use state in a probe station to which a heating and cooling apparatus having a moisture removal function for testing the electrical characteristics of a semiconductor element using a probe system according to the present disclosure is applied.
Figure 3B:
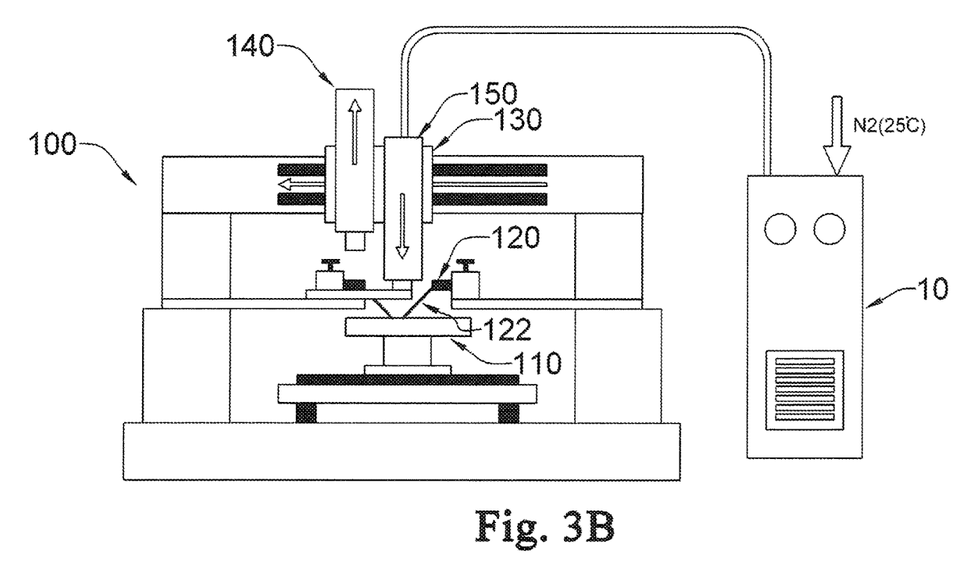
FIG. 3B is a view showing a thermo-stream use state in a probe station to which a heating and cooling apparatus having a moisture removal function for testing the electrical characteristics of a semiconductor element using a probe system according to the present disclosure is applied.

As illustrated in FIGS. 3A and 3B, the heating and cooling apparatus having a moisture removal function for testing the electrical characteristics of a semiconductor element using a probe system according to the present disclosure is provided with an insulating chuck 110 on which a wafer or a flat display panel is placed at a point at a predetermined height. Above the insulating chuck 110, a probe station 100, which is provided with a probe card 120 including multiple probe pins 122 that measure electrical characteristics while selectively coming into contact with an electrode or a pad formed on the wafer or the flat display panel, is applied. The heating and cooling apparatus of the present disclosure includes a thermo-stream 150 of a probe head 130 configured to be capable of being fed in the X-axis and Y-axis directions using a linear motor and formed as a base. In FIGS. 3A and 3B, reference numeral 140 denotes a microscope.

Figure 4:
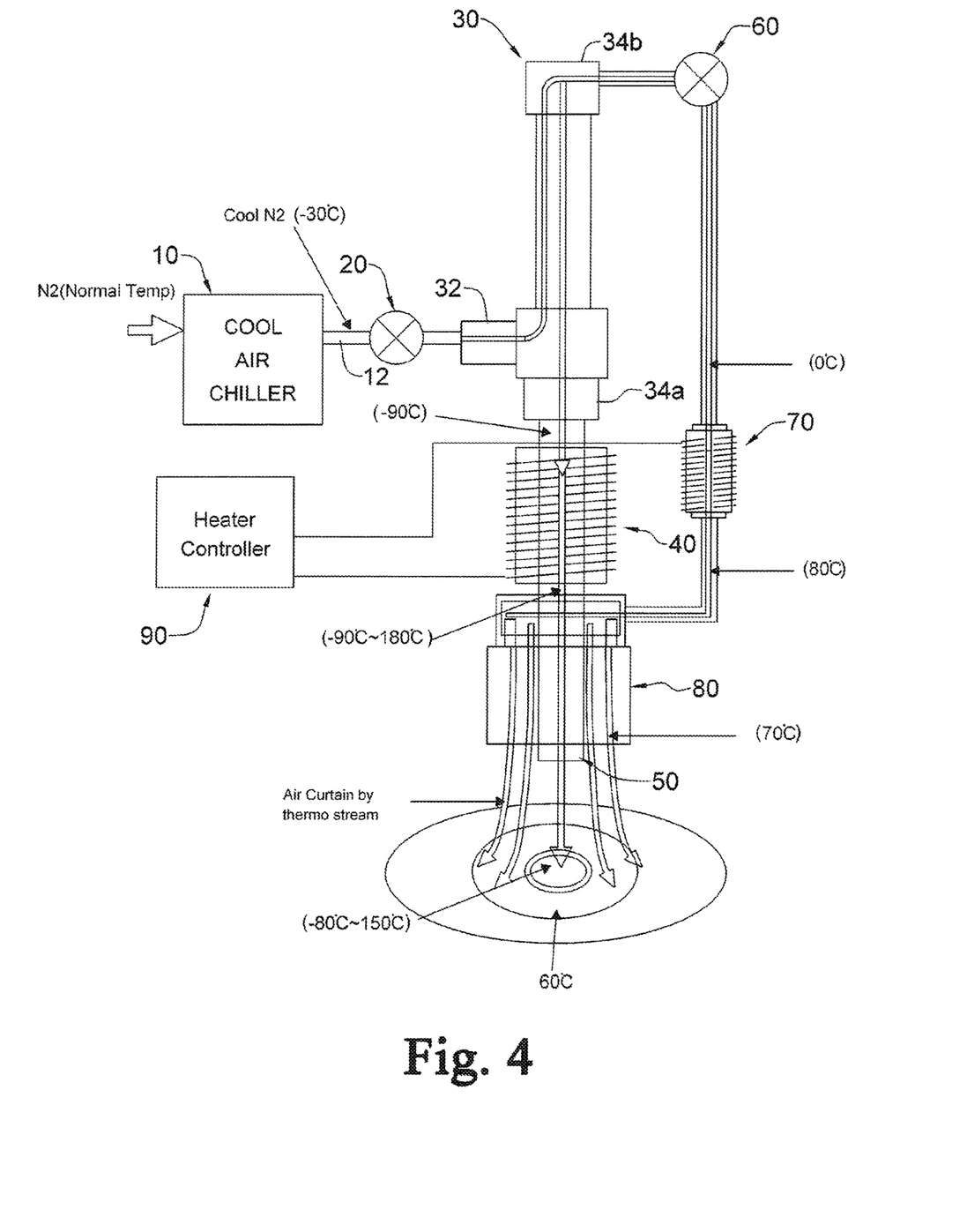
FIG. 4 is a view showing the configuration of a heating and cooling apparatus having a moisture removal function for testing the electrical characteristics of a semiconductor element using a probe system according to the present disclosure.

That is, as shown in FIG. 4, in the heating and cooling apparatus of the present disclosure, a cooling chiller 10 and the thermo-stream side provided in the probe head of the probe station are interlocked with each other, the cooling chiller 10 is configured to supply compressed air through the flow rate control device, or flow rate controller, 20 to a compressed air cooler 30 side to which the vortex tube 200 is applied. After passing through the vortex tube 200, the compressed air supplied to the compressed air cooler 30 side is subjected to temperature adjustment to a predetermined temperature via a first heater 40 and a second heater 70 and is then discharged through each of an air nozzle 50 and a dehumidifying nozzle 80.

The cooling chiller 10 is configured to primarily cool and discharge the compressed dry air (CDA or N2) of which the dew point is low, which is supplied from the outside, and which is at normal temperature, and the flow rate control device 20 is connected to an air supply pipe 12 to which air is discharged from the cooling chiller 10 and is configured to constantly adjust the flow rate and hydraulic pressure of the compressed air.

The flow rate control device 20 is provided with a heating/cooling air ratio adjustment valve and an anti-moisture heating air adjustment valve so as to realize an optimum temperature condition in conjunction with a heater controller 90.

When the compressed air adjusted by the flow rate control device 20 is input through an input port 32, the compressed air cooler 30 separates the compressed air into cold air and hot air and sprays the compressed air in both directions. For this purpose, the vortex tube 200 is built in the compressed air cooler, and is configured to discharge the compressed air introduced through the input port 32 in both directions using a vortex phenomenon (see FIG. 5).

The first heater 40 heats the cold air from an output port 34*a* at one side of the compressed air cooler 30 to a predetermined temperature and adjusts the temperature to a precise temperature required for testing the electrical characteristics. The air heated to a predetermined temperature while passing through the first heater 40 is sprayed to a measurement position for the electrical characteristic test through the cooling the air nozzle 50.

The hot air from the other output port 34*b* of the compressed air cooler 30 is adjusted to a predetermined flow rate and hydraulic pressure through an auxiliary flow rate control device 60 and is then supplied to the second heater 70 side. The second heater 70 is configured to heat the hot air passing through the auxiliary flow rate control device 60 to a high temperature required for dehumidification and then to spray it around the air sprayed from the cooling nozzle 50 through the dehumidifying nozzle 80.

The first heater 40 and the second heater 70 are configured to be interlocked with a heater controller 90, so that the compressed air passing through the compressed air cooler 30 can maintain the optimum temperature condition under the control of the heater controller 90.

Next, the operation of the present disclosure configured as described above will be described in detail below.

The heating and cooling apparatus having a moisture removal function for testing the electrical characteristics of a semiconductor element using a probe system according to the present disclosure is applied to the thermo-stream 150 of the probe station 100 to easily conduct an electrical characteristic test of the wafer or the flat display panel even at a low temperature condition below normal temperature.

First, when compressed dry air (CDA or N2), the dew point of which is low and which has a low ambient temperature (25° C.), flows from the outside through the cooling chiller 10, it is primarily cooled to about −30° C., and the primarily cooled air of −30° C. flows into the input port 32 of the compressed air cooler 30 via the flow control device 20.

At this time, since the flow rate and hydraulic pressure of the compressed air are closely correlated with the temperature to be heated or cooled, it is necessary for the compressed air to be constantly supplied while being controlled through the flow rate control device 20. In addition, the flow rate control device 20 is provided with a heating/cooling air ratio adjustment valve and an anti-moisture heating air adjustment valve to control the compressed air appropriately in conjunction with the heater controller 90, thereby maintaining the optimal temperature condition.

The compressed air adjusted by the flow rate control device 20 is supplied to the compressed air cooler 30 side and is then bidirectionally sprayed as cold air and hot air by the vortex tube 200 therein.

Figure 5:
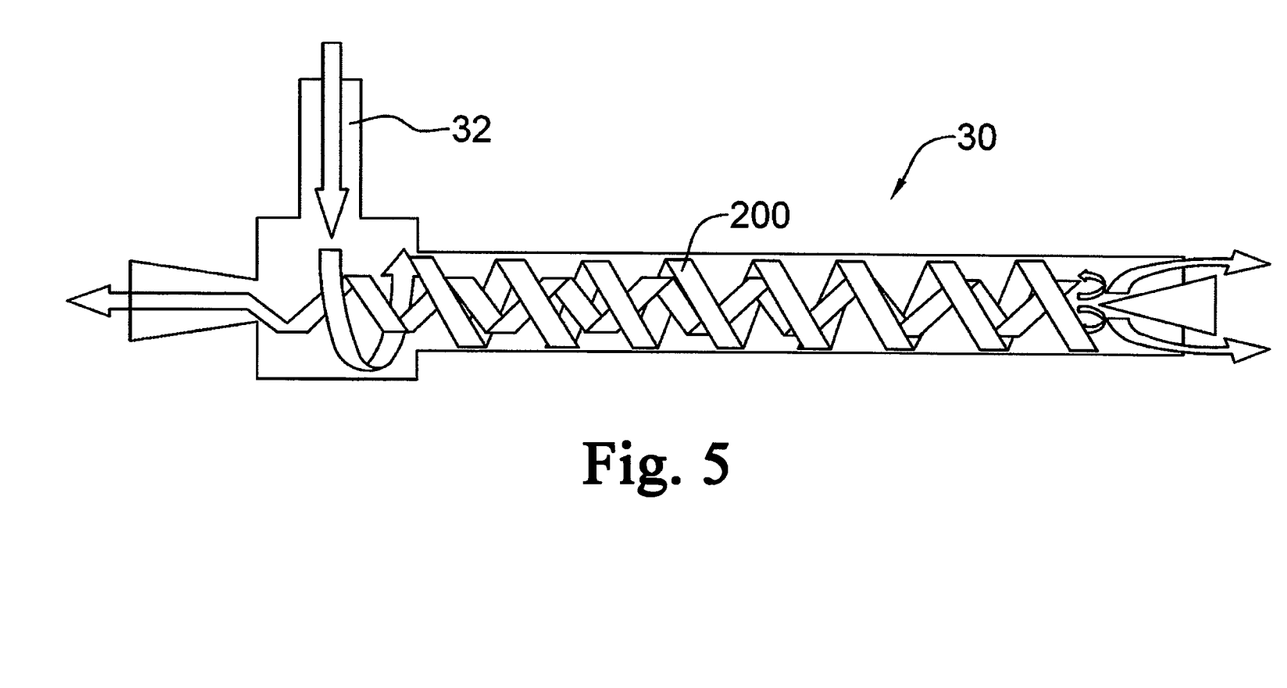
FIG. 5 is a view showing the structure of a vortex tube applied to a heating and cooling apparatus having a moisture removal function for testing the electrical characteristics of a semiconductor element using a probe system according to the present disclosure.

In this case, the respective temperatures are determined depending on the ratio between sprayed cold air and hot air. When the ratio is the maximum (cold air 2:hot air 8) at a pressure of about 5 kg/cm$^2$, it is possible to obtain air cooled by about −70° C. compared to the temperature of supplied air, and since the temperature of the supplied air is about −30° C., it is theoretically possible to obtain cold air at −100° C. Practically, air at the minimum of about −90° C. is sprayed.

Meanwhile, the cold air of about −90° C. described above is supplied to the first heater 40 through the one-side output port 34*a* and is heated to be adjusted to a temperature required for measurement.

The temperature of the vortex tube 200 can be adjusted by adjusting the ratio between the cold air and the hot air. However, it is difficult to maintain the temperature accuracy required for the electrical characteristic test of a measurement object. Particularly, since the heating temperature is closely influenced by changes in the flow rate, it is very difficult to control in practice. Since the cooled air is heated using the first heater 40, it is possible to implement accurate temperature adjustment.

Thus, as the cold air heated through the first heater 40 is sprayed into the measurement position through the cooling nozzle 50, the cooling measurement for a wafer or a flat panel display product can be performed.

In addition, relatively hot air is blown through the other output port 34*b* of the compressed air cooler 30. That is, since the input air is about −30° C., air of about 0° C. is blown out.

Therefore, the high-temperature air required for dehumidification is heated through the second heater 70 and is sprayed toward the dehumidifying nozzle 80 side.

As illustrated in FIG. 4, the dehumidifying nozzle 80 is mounted on the outer side of the cooling nozzle 50 in the form of a large nozzle so that the air heated through the compressed air cooler 30 and the second heater 70 flow out through the dehumidifying nozzle 80. Then, a hot and low-pressure air layer is formed and the cooled air is diluted with the hot air while moving toward the outer side so that the temperature is changed to normal temperature. Thus, the air acts to prevent moisture from being generated on the wafer or the flat display panel on which a semiconductor element is located.

While an embodiment of the present disclosure has been shown and described, the present disclosure is not limited to the specific embodiment described above. Various changes and modifications can be made by a person ordinarily skilled in the art without departing from the scope of the spirit and scope of the present disclosure, and the changes and modifications shall not be understood individually from the technical idea or view point of the present disclosure.

Thus, having described the invention, what is claimed is:

1. A heating and cooling apparatus having a moisture removal function for testing electrical characteristics of a semiconductor element using a probe system, the apparatus comprising:

a cooling chiller configured to primarily cool and discharge compressed air which is supplied from an outside and has normal temperature;

a flow rate controller installed in an air supply pipe to which the compressed air from the cooling chiller is discharged and configured to adjust a flow rate and a hydraulic pressure of the compressed air;

a compressed air cooler configured to separately spray the compressed air, which has been adjusted in the flow rate controller, into cold air and hot air after the compressed air has flowed thereinto;

a first heater configured to heat cold air from a port at one side of the compressed air cooler to a predetermined temperature so as to adjust the temperature to an accurate temperature required for testing the electrical characteristics;

an air nozzle configured to spray the air heated through the first heater to a measurement position for the electrical characteristic test;

a second heater configured to heat hot air from another port of the compressed air cooler to a high temperature required for dehumidification; and a dehumidifying nozzle configured to spray the air heated by the second heater around air sprayed from the air nozzle; wherein the compressed air cooler includes a vortex tube such that air introduced through the flow rate controller is discharged as cold air and hot air in opposite directions due to a vortex phenomenon.

2. The apparatus of claim 1, wherein the hot air discharged from the compressed air cooler is subjected to adjustment of flow rate and hydraulic pressure through an auxiliary flow rate controller.

* * * * *

UNITED STATES PATENT AND TRADEMARK OFFICE
CERTIFICATE OF CORRECTION

| | |
|---|---|
| PATENT NO. | : 11,149,991 B2 |
| APPLICATION NO. | : 16/277387 |
| DATED | : October 19, 2021 |
| INVENTOR(S) | : Yang Yoon Seon |

It is certified that error appears in the above-identified patent and that said Letters Patent is hereby corrected as shown below:

In the Specification

Column 5, Line 10, delete "through the cooling the air nozzle 50." and substitute therefor -- "through the air nozzle 50." --

Signed and Sealed this
Thirty-first Day of May, 2022

Katherine Kelly Vidal
*Director of the United States Patent and Trademark Office*